United States Patent [19]

Kobayashi et al.

[11] Patent Number: 4,880,163

[45] Date of Patent: Nov. 14, 1989

[54] GAS FEEDING NOZZLE FOR A CHEMICAL VAPOR DEPOSITION APPARATUS

[75] Inventors: Shigeyoshi Kobayashi, Kawasaki; Susumu Yaba; Tomoya Takigawa, both of Yokohama, all of Japan

[73] Assignee: Asahi Glass Company, Ltd., Tokyo, Japan

[21] Appl. No.: 149,084

[22] Filed: Jan. 27, 1988

[30] Foreign Application Priority Data

| Jan. 27, 1987 | [JP] | Japan | 62-15062 |
| Feb. 3, 1987 | [JP] | Japan | 62-21683 |
| Feb. 10, 1987 | [JP] | Japan | 62-27370 |
| Feb. 10, 1987 | [JP] | Japan | 62-27371 |

[51] Int. Cl.$^4$ .................................................. B05B 1/14
[52] U.S. Cl. .................................... 239/422; 239/555; 239/568
[58] Field of Search ............. 239/418, 422, 553-553.5, 239/568, 555, 595

[56] References Cited

U.S. PATENT DOCUMENTS

| 2,685,916 | 8/1954 | Maztt | 239/555 |
| 2,713,894 | 7/1955 | Sage | 239/555 |
| 3,381,114 | 4/1968 | Nakanuma | 219/395 |
| 3,606,974 | 9/1971 | Steele | 239/568 |
| 3,790,087 | 2/1974 | Basyas et al. | 239/555 X |
| 4,081,136 | 3/1978 | Addoms et al. | 239/555 X |
| 4,351,267 | 9/1982 | Kalbskopf et al. | 427/255.1 |
| 4,351,861 | 9/1982 | Henery | 118/718 |

FOREIGN PATENT DOCUMENTS

| 029809 | 6/1981 | European Pat. Off. . |
| 166383 | 1/1986 | European Pat. Off. . |
| 2355058 | 7/1974 | Fed. Rep. of Germany . |
| 55-120142 | 9/1980 | Japan . |
| 57-104659 | 6/1982 | Japan . |

OTHER PUBLICATIONS

Thin Solid Films, vol. 77, Nos. 1,3, 1981, pp. 51–63, Elsevier Sequoia, NL; J. M. Blocher, Jr.: "Coating of glass by chemical vapor deposition".

Primary Examiner—Andres Kashnikow
Assistant Examiner—Kevin P. Weldon
Attorney, Agent, or Firm—Oblon, Spivak, McClelland, Maier & Neustadt

[57] ABSTRACT

A gas feeding nozzle feeds at least one kind of gas to form a thin film on a substrate by a normal pressure vapor deposition process. The nozzle is constituted by a plurality of plate-like bodies. A single or a plurality of slit-like gas discharging apertures are formed by stacking spacers each having at least one cut portion in the gas-discharging direction and partition plates for separating a stream of gas from another stream of gas adjacently flowing. A gas supplying plate with at least one gas supplying opening and at least one groove for flowing the gas in its width direction is attached on at least one of the outermost plate-like bodies. In order to form a single or a plurality of gas feeding paths between the gas supplying plate and the spacer for forming the gas discharging aperture, a single or a plurality of elongated holes, which are extended to the substantially entire width with respect to the width of the gas stream discharged, are formed in the partition plates and the spacers interposed between the gas supplying plate and the spacer.

24 Claims, 8 Drawing Sheets ized in that the nozzle is constituted by a plurality of plate-like bodies; the plate-like bodies are composed of at least one spacer, partition plate and gas supplying plate, wherein a single or a plurality of slit-like gas discharging apertures are formed by stacking alternately the at least one spacer each having at least one cut portion in the gas-discharging direction and the at least one partition plate for separating a stream of gas flowing adjacently.

GAS FEEDING NOZZLE FOR A CHEMICAL VAPOR DEPOSITION APPARATUS

BACKGROUND OF THE INVENTION

1. Field of the Invention

The present invention relates to a gas feeding nozzle for a normal pressure chemical vapor deposition apparatus.

There have so far been known a physical vapor deposition process, a chemical vapor deposition process, a spraying process, a dipping process and so on as methods of forming a thin film on the surface of a substrate such as glass, metal, and the other various materials. These techniques have been selected depending on conditions such as the material or the thickness of film required for manufacturing. Especially, the physical vapor deposition process and the chemical vapor deposition process have been generally employed as methods capable of forming a film having a thickness of about several 100 Å to several 10,000 Å in a uniform manner and having a desired composition. Particularly, for the demand of use of a large-sized substrate and for high processability in industrial scale, a normal pressure chemical vapor deposition process (hereinbelow, referred to as a normal pressure CVD process) is used as an advantageous technique.

When large-sized substrates are produced by the normal pressure CVD process in industrial scale, the substrates are carried into a CVD chamber which is provided with a carrying means such as a belt conveyor or rollers to continuously carrying the substrates into the chamber and a nozzle having a wide width for feeding a reactive gas, the CVD chamber having a predetermined temperature profile, and a thin film is formed on the substrates by supplying the reactive gas from the nozzle.

Heretofore, it has been difficult to form the thin film having a uniform thickness of the large-sized substrates by the above-mentioned method. For instance, when a thin film of electric conductive tin oxide is to be formed on glass substrate having a width of 300 m/m, the scattering of the film thickness on the substrate in its width direction is at most about ±10%.

SUMMARY OF THE INVENTION

It is an object of the present invention to provide a gas feeding nozzle for a CVD apparatus capable of minimizing the scattering in the thickness of a thin film.

The inventors of this application have extensively studied on causes of ununiform thickness of the thin film on the substrate when the thin film is formed by the normal pressure CVD process. As a result, the inventors have found the fact that such undesired result largely depends on the ununiform flow velocity and flow rate of a gas or gasses flowing from a nozzle for feeding a reactive gas. The present invention concerning a gas feeding nozzle for CVD apparatus can be attained by eliminating the above-mentioned problem.

In an aspect of the present invention, there is provided a gas feeding nozzle for feeding at least one kind of gas to form a thin film on a substrate by a normal pressure chemical vapor deposition process, characterized in that the nozzle is constituted by a plurality of plate-like bodies; the plate-like bodies are composed of at least one spacer, partition plate and gas supplying plate, wherein a single or a plurality of slit-like gas discharging apertures are formed by stacking alternately the at least one spacer each having at least one cut portion in the gas-discharging direction and the at least one partition plate for separating a stream of gas flowing adjacently.

In another aspect of the present invention, there is provided a gas feeding nozzle for feeding at least one kind of gas to form a thin film on a substrate by a normal pressure vapor deposition process, characterized in that the nozzle is constituted by a plurality of plate-like bodies; the plate-like bodies are composed of at least one spacer, partition plate and gas supplying plate; a single or a plurality of slit-like gas discharging apertures are formed by stacking the at least one spacer each having at least one cut portion in the gas-discharging direction and the at least one partition plate for separating a stream of gas from another stream of gas adjacently flowing; the at least one gas supplying plate which is provided with at least one gas supplying opening and at least one groove for flowing the gas in its width direction is attached on at least one of the outermost plate-like bodies, wherein in order to form a single or a plurality of gas feeding paths between the gas supplying plate and the spacer for forming the gas discharging aperture, a single or a plurality of elongated holes which are extended to the substantially entire width with respect to the width of the gas stream discharged, ate formed in the partition plates and spacers interposed between the gas supplying plate and the spacer.

In another aspect of the present invention, there is provided a gas feeding nozzle for feeding at least one kind of gas to form a thin film on a substrate by a normal pressure vapor deposition process, characterized in that the nozzle is constituted by a plurality of plate-like bodies, each of plate-like bodies having a recess for forming a gas-flowing path, which comprises a first groove elongated in the width direction of the plate-like bodies, a plurality of second grooves in an elongated form, each having one end communicated with the first groove, third grooves each having one end communicated with each of the other end of the second grooves and the other end which is gradually widened in the direction of gas flow to render the gas stream flowing in each of the third grooves to be merged with the gas stream flowing the adjacent grooves, and a fourth groove extending between the ends of the third grooves at which the gas streams are merged and a gas discharging aperture.

In another aspect of the present invention, there is provided a gas feeding nozzle for feeding at least one kind of gas to form a thin film on a substrate by a normal pressure chemical vapor deposition process, characterized in that the nozzle is constituted by a plurality of plate-like bodies; the plate-like bodies include at least one gas supplying plate; the gas supplying plate is provided with at least one gas supplying opening and at least one groove for flowing the gas in its width direction and is attached to at least one of the outermost plate-like bodies; and a single or a plurality of slit-like gas discharging apertures are formed between the gas supplying plate and the other plate-like body or between the other plate-like bodies, wherein in order to form a single or a plurality of gas flowing paths between the gas supplying plate and the plate-like body for forming the gas discharging aperture, a single or a plurality of elongated holes, which are extended to the substantially entire width with respect to the width of the gas stream discharged, are formed in the plate-like bodies interposed between the gas supplying plate and the plate-like body for forming the gas discharging aperture.

Preferred embodiments of the present invention will be described with reference to the drawings.

DETAILED DESCRIPTION OF THE PREFERRED EMBODIMENT

Figure 1:
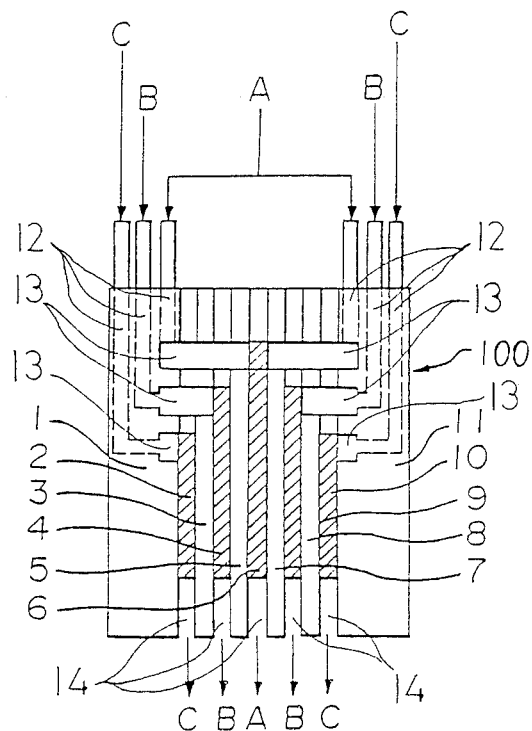
FIG. 1 is a vertical cross-sectional view of an embodiment of the gas feeding nozzle for a CVD apparatus of the present invention.
Figure 2:
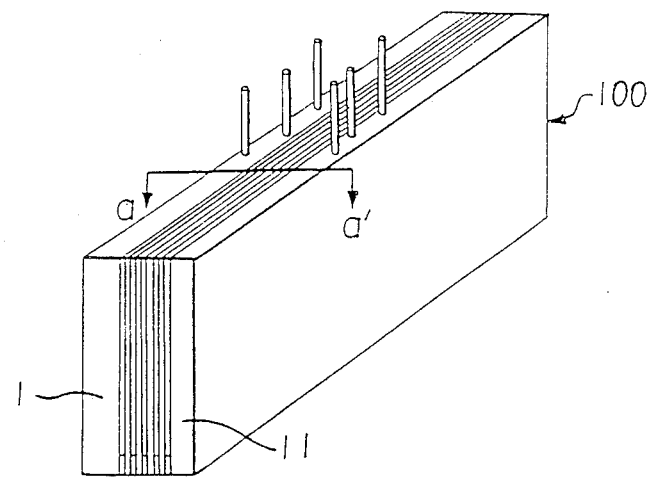
FIG. 2 is a perspective view of the gas feeding nozzle as shown in FIG. 1.
Figure 3:
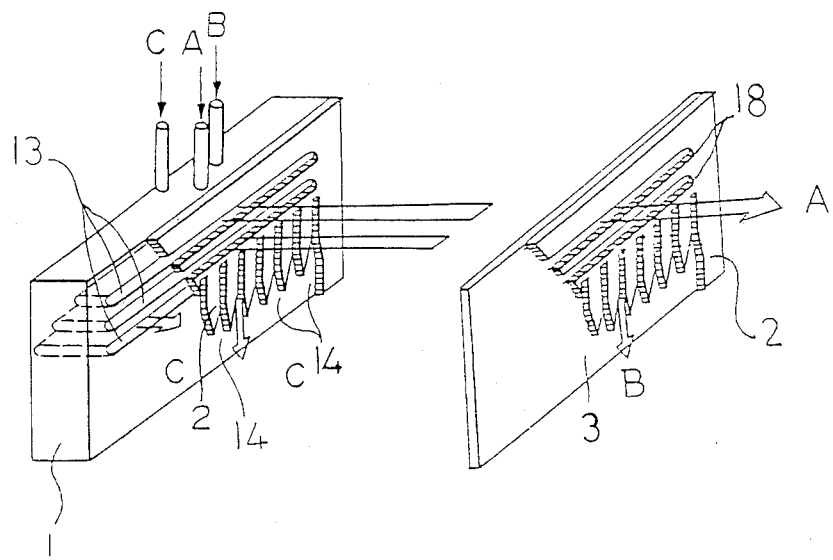
FIG. 3 is a schematic view for illustrating the gas feeding nozzle of the present invention.

FIGS. 1 to 3 show a basic construction of the gas feeding nozzle for a CVD apparatus of the present invention, wherein three kinds of gasses A, B, C (which may be a single component or a mixture gas) are discharged through slits having five-layered structure.

FIG. 1 is a cross-sectional view taken along a line a-a' of the gas feeding nozzle 100 shown in FIG. 2. In FIGS. 1 to 3, reference numerals 1 and 11 designate gas supplying plates, numerals 2 and 10 designate first spacers for defining flow paths for the gas C, numerals 3 and 9 designate partition plates for separating flow paths for the gas B from the flow paths for the gas C, numerals 4 and 8 designate second spacers for defining flow paths for the gas B, numerals 5 and 7 designate second partition plates for separating a flow path for the gas A from the flow paths for the gas B and a numeral 6 designates a spacer for forming the flow path for the gas A. In the gas supplying plates 1 and 11, there are formed gas supplying openings 12 and grooves 13 extending in the direction of width of the plates to uniformly feed the gasses. The gas supplying plates 1 and 11 are not always necessary at both sides, but can be provided at a single side. The spacers 2, 4, 6, 8, 10 for forming the slit-like discharging apertures 14 for discharging each of the gasses preferably have at least one cut portion in the direction for discharging the gas. However, they may have another construction so long as far as a stream of gas having a uniform thickness can be obtained. A single or plurality of elongated holes 18 are formed in plate-like bodies such as the spacers and the partition plates, which partition plates are interposed between a gas supplying plate and a spacer or between spacers for forming the slit-like gas discharging aperture through which the gas is discharged, at the substantially entire width of the plate-like bodies, whereby the gasses fed in the gas supplying plate are separately passed through the elongated holes 18. In the nozzle shown in FIG. 2, different kind of gasses (i.e. five kinds) can be fed through the slits in the five-layered structure.

In the present invention, it is preferable that the thickness of the spacers for forming the flow paths of the gasses is in the range of 0.1 mm–10 mm, especially, 0.2 mm–5 mm. When the thickness is less than that value, it is difficult to precisely finish the spacers for practical use, and uniformity in the air gap of the slits is lost so that uniformity of gas flow in the direction from the slits is impaired. On the other hand, when the thickness is greater than that value, the distance between adjacent gas streams after discharging becomes large, whereby mixing and diffusion of the gasses are insufficient, and a sufficient deposition of the thin film on the substrate can not be obtained.

The thickness of the partition plates for separating the adjacent gas streams is preferably in the range of 0.1 mm–10 mm, especially, 0.2 mm–5 mm. When the thickness of the partition plates is less than that value, it is difficult to precisely finish the partition plates for practical use, and the air gap in the slits may be ununiform and there easily results thermal deformation such as bending of the slits. On the other hand, when the thickness is greater than that value, the distance between the adjacent gas streams after discharging becomes large, whereby mixing and diffusion of the gasses are insufficient, and a sufficient deposition of the film on the substrate can not be obtained.

In the preferred embodiment of the present invention, a difference in static pressure between the gas supplying opening and the gas discharging aperture when the gas is discharged through the nozzle is determined to be more than 10 times of the maximum difference in static pressure distribution inside the groove of the gas supplying plate in which the gas flows in the direction of width. When the difference in the static pressure is smaller than 10 times, there appears ununiform distribution in flow rate of the gas in the direction of width. In this case, it is desirable that the static pressure ratio is rendered to be more than 10 by increasing the dimension (such as the width and the depth) of the groove of the gas supplying plate.

In the following, description will be made as to the spacers for forming the flow paths of the gasses.

Figure 4:
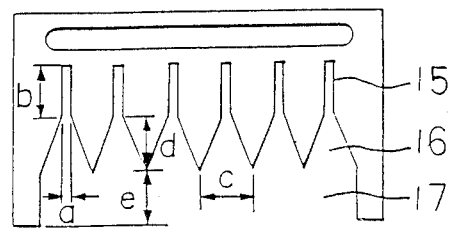
FIGS. 4 and 5 are respectively front views of embodiments of the spacers used for the gas feeding nozzle of the present invention.
Figure 5:
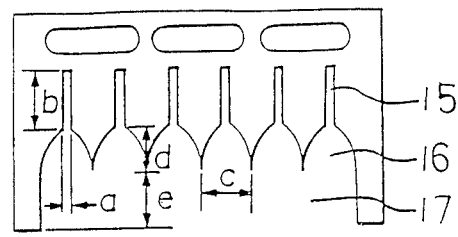

FIGS. 4 and 5 are respectively front views as examples in the construction of the spacers. To provide flow paths for the gasses discharged through the spacers, each of the spacers has a plurality of slit-like discharging apertures 14. The aperture has a plurality of first thin cut portions 15 having a width (a) of 0.1 mm–100 mm and a length (b) of 0.1 mm–150 mm, second cut portions 16 each having a length (d) of 150 mm or less and an expansion ratio (c/a) of width of the flow path of 500 or less which is communicated with each of the first cut portions, the flow path gradually increasing in the direction of gas flow to finally render the gas to be merged with the gas flowing through the adjacent second cut portion or cut portions, and a third cut portion 17 having a length (e) of 100 mm or less to discharge the merged gasses from the gas discharging aperture. In the spacers, when the width (a) of the first thin cut portions 15 is less than 0.1 mm, it is difficult to precisely finish the spacer, whereas when the width (a) is greater than 100 mm, it is difficult to maintain the distance between the slits. In either case, uniformity in flow rate of the discharged gas in the direction of width of the spacers is impaired.

When the length (b) of the first thin cut portions 15 is less than 0.1 mm, it is difficult to precisely finish them. On the other hand, when it is greater than 150 mm, the size of the nozzle becomes too large and it is unsuitable for practical use.

When the length (d) of the second cut portions 16, which are communicated with the first cut portions 15 and have the flow path widened in the direction of gas flow, is greater than 150 mm, the size of the nozzle becomes too large and it is unsuitable for practical use. When the expansion rate (c/d) of the width of flow path is greater than 500, the gas ejected from the first cut portion 15 is discharged from the nozzle without sufficiently spreading in the direction of width, whereby uniformity of the gas stream in the direction of width is impaired.

When the length of the third cut portion 17, which extends from the end portion of the third cut portions where the gasses are merged to the gas discharging aperture, is greater than 100 mm, it is difficult to maintain the distance between the slits. The shape of the second cut portion for widening the flow path may be in a linear form as shown in FIG. 4 or in a curved form as shown in FIG. 5. When an additional flow path for another gas is needed, at least one through hole may be formed at the upper portion of the first cut portions 15 as shown in FIGS. 4 and 5. An elongated through hole may be formed extending at the substantially entire width so that the gas can be supplied to all thin cut portions. Further, it is possible to divide the elongated through hole into a plurality of through holes at an area that is apart from the thin cut portion unless the ross section area of flow path is greatly reduced, as shown in FIG. 5.

With reference to FIG. 3 illustrating the gas feeding nozzle of the present invention, explanation will be made how the supplied gasses flow.

The gasses supplied to the gas supplying plate through the gas supplying openings are introduced in the grooves formed in the plate and spread uniformly in the direction of the width (the gas A is fed in the upper groove, the gas B is fed in the middle groove and the gas C is fed in the lower groove). The gasses can be uniformly distributed in each of the grooves at its entire width by determining the size of the grooves in such a manner that the maximum difference in static pressure distribution in the grooves is sufficiently smaller than the pressure difference between the gas supplying opening and the gas discharging aperture when the gas is discharged through the nozzle. Each of the gasses spread uniformly in each of the grooves is passed through the elongated through holes formed in the spacers and the partition plates in a stacking form to be discharged from the slit-like gas discharging apertures. For instance, the gas C is fed into the lower groove formed in the gas supplying plate 1 and is passed through cut portions formed in the spacer 2 which assures the flow path in a slit form. The partition plate 3 is provided adjacent to the spacer 2 to separate the gas C from the gas B and accordingly, the gas C is not fed to the adjacent slit-like flow path. Further, two elongated through holes are formed in the spacer 2 and the partition plate 3 to form the flow paths for the gasses A and B. Thus, since each of the gasses which flow out from the grooves in the gas supplying plate is passed through each of the elongated through holes formed in the spacers and partition plates in the stacking form to be discharged from the slits, uniformity of the gas flow in the direction of width, the dimension of which can be obtained by the grooves of the gas supplying plate, can be maintained. Each of the spacers is made to have cut portions which are cut in the direction of discharging of the gas introduced from the elongated through hole. Further, end portion of each of the remaining portions is preferably projected to the side of the gas discharging aperture in order to maintain the air gap in the slits to be constant. However, the spacer may have another construction so long as above-mentioned object can be attained.

Figure 6:
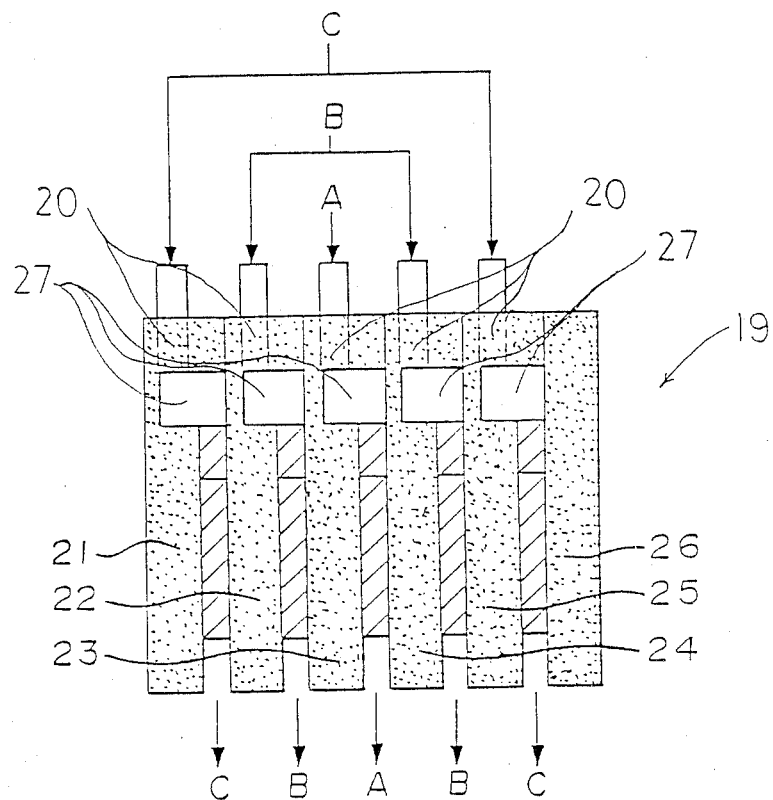
FIG. 6 is a vertical cross-sectional view of another embodiment of the gas feeding nozzle of the present invention.
Figure 7:
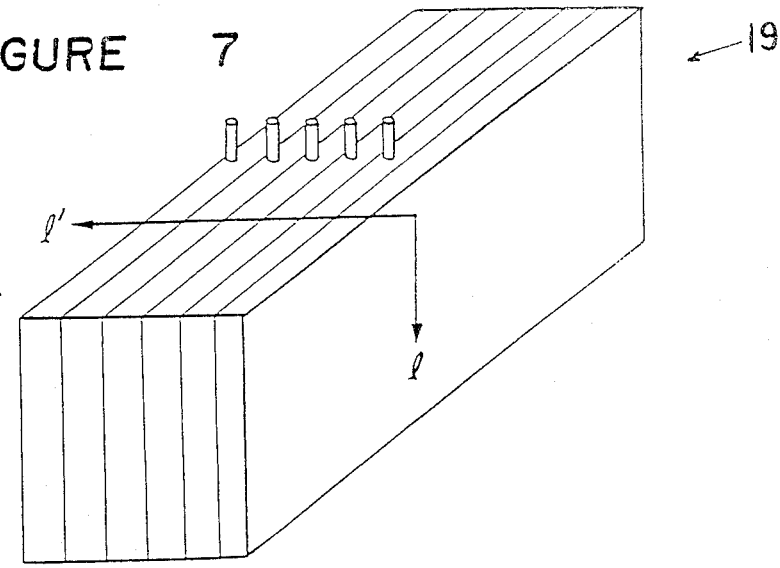
FIG. 7 is a perspective view of the gas feeding nozzle shown in FIG. 6.
Figure 8:
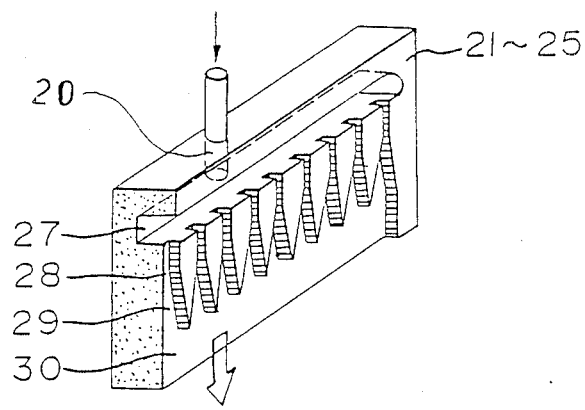
FIG. 8 is a schematic view for illustrating the gas feeding nozzle of the present invention.

FIGS. 6 to 8 show a basic construction of the gas feeding nozzle in which three kinds of gasses A, B, C are discharged through the slits having five-layered structure. The gas may be a single component or a mixture gas.

FIG. 6 is a cross-sectional view taken along a line 1-1' of the nozzle shown in FIG. 7.

In FIG. 6, reference numeral 19 designates a gas feeding nozzle, reference numerals 20 designate gas supplying openings, reference numerals 21, 25 designate first plates for forming flow paths for the gas C, numerals 22, 24 designate second plates for forming flow paths for the gas B, a numeral 23 designates a third plate for forming a flow path for the gas A, and a numeral 26 designates an end plate for preventing the gas C from being released in the atmosphere.

FIG. 8 shows a basic structure of each of the plates 21–25. Each of the plates is provided with a recess for forming the flow path for the gas. The recess comprises a first groove 27 elongated in the direction of the width of the plates, a plurality of second grooves 28 in a thin form each one end of which is communicated with the first groove 27, third grooves 29 each having one end communicated with the other end of each of the second grooves 28 and the other end of the third grooves 29 being gradually widened in the direction of gas flow to render the gas stream flowing the groove 29 to be merged with the gas stream flowing the adjacent groove 29, and a fourth groove 30 extending between the ends of the third grooves at which gas streams are merged to form the gas discharging aperture. They are arranged in the sequential order of flowing the gas. The gas supplying opening 20 may be formed in each of the plates 21–25, or the gas supplying openings may be formed only in the plates 21, 26 at both sides to feed three kinds of the gasses. The opening is communicated with the first groove 27. In either case, different kind of gasses can be discharged separately through the respective slit in the five-layered arrangement.

In the above-mentioned embodiment of the present invention, it is preferable that the thickness of each of the plates for forming the flow paths is in the range of 0.2 mm–20 mm, especially, 0.5 mm–10 mm. When the thickness of the plates is less than the above-mentioned value, it is difficult to finish precisely the plates for practical use. Also, uniformity in the gas stream discharged in the direction of the width of the plates is impaired. On the other hand, when the thickness is greater than the value, mixing and diffusion of the gas streams become insufficient because the distance between the adjacent gas streams after discharging is large, whereby a sufficient deposition of the film on the substrate can not be obtained.

Figure 9:
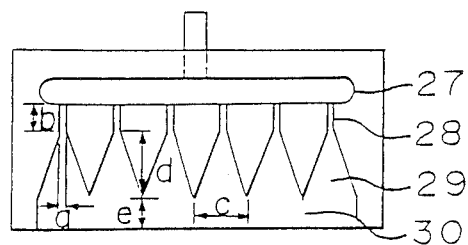
FIGS. 9 and 10 are respectively front views of embodiments of spacers used for the gas feeding nozzle of the present invention.
Figure 10:
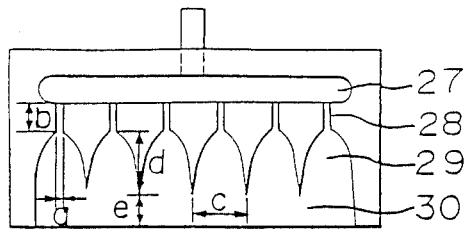

FIGS. 9 and 10 show examples of the plates used for the above-mentioned embodiment. For the first groove 27 extended in the width direction in the plate to feed the gas supplied from the gas supplying opening in the width direction, it is desirable that the groove 27 has a larger volume in consideration of the thickness of the plate and the size of an injector. The second thin groove 28 having one end communicated with the first groove 27 desirably has a width (a) of 0.1 mm–100 mm, a depth of 0.1 or more and a length (b) of 0.1 mm–150 mm. When the size of the second groove is less than the above-mentioned values, it is difficult to finish the second groove accurately, and there results difference in flow rate of the gas passing through the thin grooves 28, whereby uniformity of the gas streams is impaired. When the width (a) of the groove 28 is greater than 100 mm, it is difficult to maintain the air gap in the slits to thereby result in ununiformity of the gas streams in the width direction. When the length (b) of the groove 28 is greater than 150 mm, the size of the nozzle is large and it can not be used practically. The third grooves 29 each having one end communicated with each of the second grooves 28 and the other end being gradually widened in the direction of gas flow preferably has a length (a) of 150 mm or less, a depth of 0.1 mm or more and an expansion ratio of the surface area of flow path of 500 or less, where the expansion ratio of the surface area of flow path is expressed as:

Expansion ratio of the surface area of flow path =

$$\frac{\text{The depth at the end where the gas streams are merged}}{\text{The depth of the thin groove} \times \text{the width } (a)} \times \text{the width } (c)$$

When the length (d) is greater than 150 mm, the size of the nozzle becomes large and it can not be practically used. When the depth is 0.1 mm or less, it is difficult to precisely machine the groove. When the expansion ratio of the surface area of flow path is greater than 500, the gas ejected from the thin groove 28 does not sufficiently spread in the width direction; accordingly, uniformity of gas streams in the width direction of the grooves is impaired.

The shape of the third groove in which the flow path is gradually widened may be in a linear form as shown in FIG. 9 or may be in a curved form as shown in FIG. 10.

It is desirable that the length (e) of the fourth groove 30 extending from the end portions of the third grooves to the discharging aperture is 100 mm or less. When the length of the fourth groove 30 is greater than that value, it is difficult to maintain the air gap in the slits, and uniformity of the gas stream in the width direction is impaired.

With reference to FIG. 8 for illustrating the gas feeding nozzle for a CVD apparatus of the present invention, explanation will be made as to how the gasses flow.

A gas introduced into the first plate through a gas supplying opening is fed to the first elongated thin groove 27 extending in the width direction of the first plate to spread in the width direction. The gas is then passed through the recess formed in the plate, i.e. the second thin grooves 28, the third grooves 29 whose flow path is widened in the direction of gas flow and the fourth groove 30 extending from the end of the third grooves to the aperture, to be discharged therethrough. The second thin grooves 28 are made precisely to have the substantially same size and to provide a sufficient flow resistance to the gas flowing therethrough. Accordingly, the gas flowing in the second grooves 28 flows at the substantially same flow rate. Then, the gas fed to the third grooves 29 spreads in the width direction of the grooves, and is regulated in the fourth groove 30 extending from the end portions of the third grooves at which the gas streams are merged to the gas discharging aperture, whereby the merged gas stream is discharged with a uniform stream. Projections formed by forming the third grooves 29 maintain the gap of the slit near the gas discharging aperture 30 to be constant.

Figure 11:
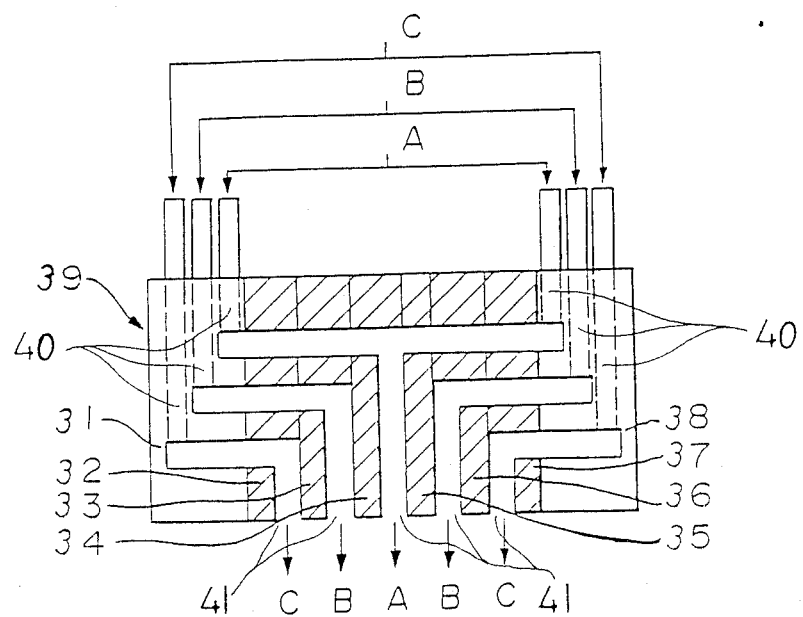
FIG. 11 is a vertical cross-sectional view of another embodiment of the gas feeding nozzle of the present invention.
Figure 12:
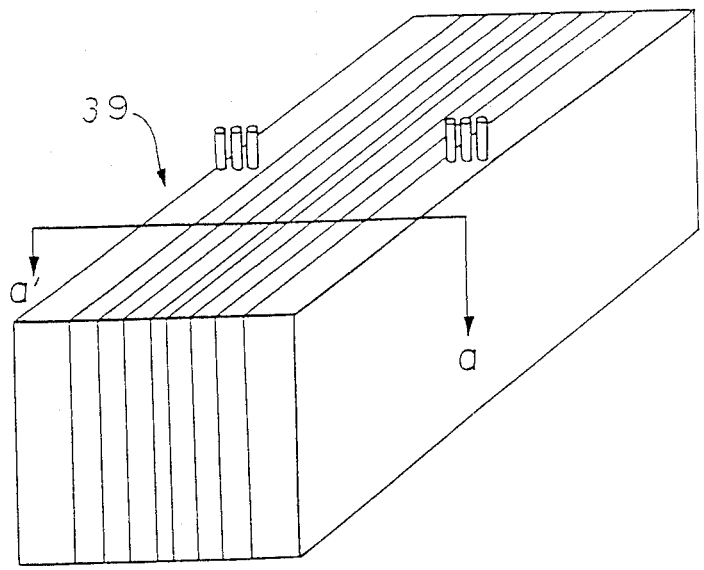
FIG. 12 is a perspective view of the gas feeding nozzle shown in FIG. 11.
Figure 13:
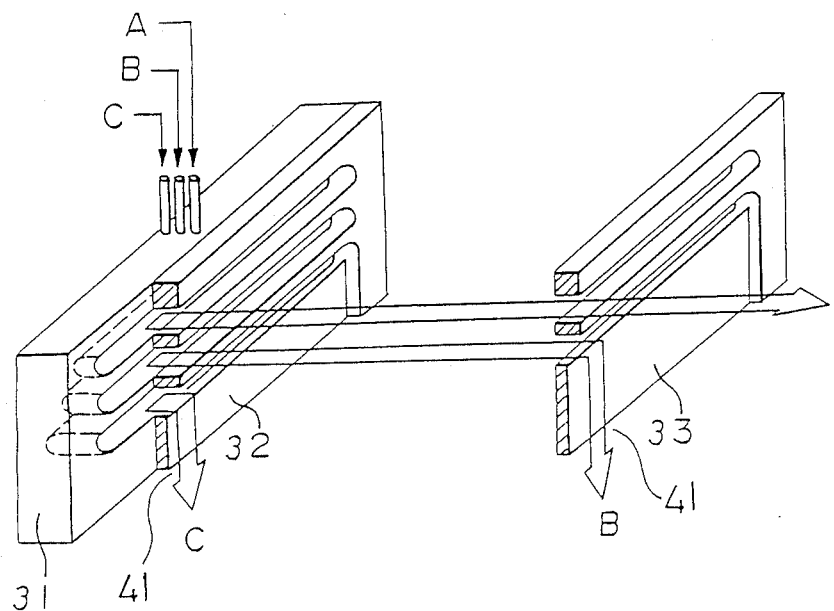
FIG. 13 is a schematic view for illustrating the gas feeding nozzle of the present invention.

FIGS. 11–13 show a basic construction of the gas feeding nozzle for a normal pressure CVD apparatus in which three kinds of gasses A, B and C (the gasses may be a single component or a mixture gas) are discharged through the respective slits having five-layered structure.

FIG. 11 is a cross-sectional view taken along a line a–a' of the gas feeding nozzle 39 shown in FIG. 12 in a perspective view.

In the FIGS. 11–13, reference numerals 31, 38 designate gas supplying plates, numerals 32, 37 designate first plates for forming flow paths for the gas C, numerals 33, 36 designate second plates for forming flow paths for the gas B, a numeral 34 designates a third plate for forming a flow path for the gas A, a numeral 35 designates a fourth plate for separating the gas A from the gas B, and numerals 40 designate gas supplying openings. Each of the gas supplying plates 31, 38 is provided with a plurality of grooves for supplying the introduced gas in its width direction. The gas supplying plate need not always be attached to both sides of the nozzle, but it may be attached to only a side. To provide separate flow paths for each of the gasses, a single or a plurality of elongated through holes, which are extended to the substantially entire width with respect to the width of the gas stream discharged, are formed in the plates for forming a slit-like gas discharging aperture 41 through which the gas stream is discharged. The elongated through holes may be split into a plural number unless the surface area of the flow paths is greatly reduced. In the embodiment shown in FIGS. 11–13, it is possible that five kinds of gasses are separately discharged from five-layered slits.

In the embodiment described above, it is preferable that a difference in static pressure between the gas supplying opening and the gas discharging aperture when the gas is discharged from the nozzle is more than 10 times the maximum difference in static pressure distribution inside the grooves for flowing the gas in its width direction of the gas supplying plate. When the difference in static pressure is smaller than that value, there appears ununiform distribution of the flow rate of the path in the width direction. In this case, accordingly, the size (depth and width) of the grooves in the gas supplying plate is made larger so that the static pressure ratio is more than 10.

The flow of the gas will be described with reference to FIG. 13 for illustrating the gas feeding nozzle for a normal pressure CVD apparatus.

The gasses A, B, C are introduced separately into the grooves formed in the gas supplying plate 31 through the respective gas supplying openings to be spread in their width direction. In FIG. 13, the gas A is introduced in the upper groove, the gas B is introduced in the middle groove and the gas C is introduced in the lower groove. Each of the gasses is easily fed into each of the grooves at their entire width by determining the size of the grooves so that the maximum difference in static pressure distribution of each of the gasses in each of the grooves is sufficiently small with respect to the reference pressure between each of the gas supplying openings and the gas discharging aperture when the gas is discharged through the nozzle. Each of the gasses in each of the grooves is passed through each of the elongated through holes formed in the plates constituting the nozzle to be discharged through each of the slits. Since the elongated through holes are extended to the substantially entire width with respect to the width of the gas stream discharged, uniformity of the flow rate of each of the gasses is not impaired throughout the entire flow paths extending from the grooves in the gas supplying plates to the gas discharging aperture. For instance, the gas C is introduced into the groove formed in the gas supplying plate 31, and then, is passed through the elongated through hole formed in the plate 32 and is finally discharged through the slit-like discharging aperture as shown in FIG. 13. The plate 32 is also provided with elongated through holes for forming the flow paths for the gasses A, B.

Figure 14:
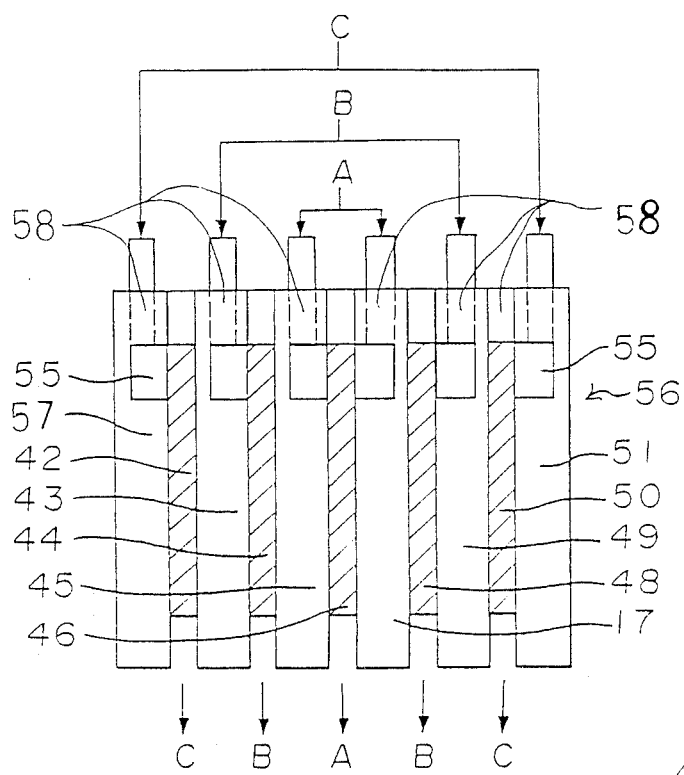
FIG. 14 is a vertical cross-sectional view of another embodiment of the gas feeding nozzle of the present invention.
Figure 15:
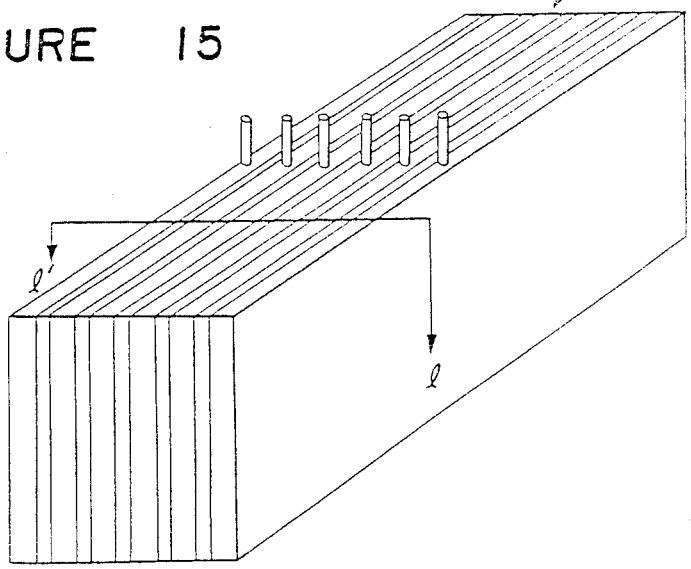
FIG. 15 is a perspective view of the gas feeding nozzle shown in FIG. 14.
Figure 16:
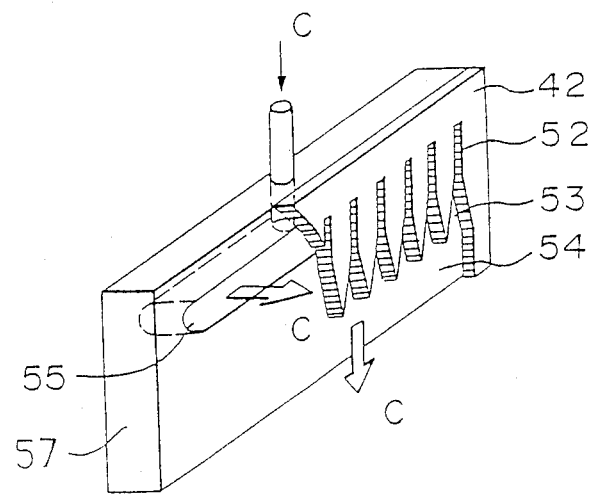
FIG. 16 is a schematic view for illustrating the gas feeding nozzle of the present invention.

FIGS. 14-16 show a basic construction of the gas feeding nozzle for a CVD apparatus in which three kinds of gasses A, B, C (they may be a single component or a mixture gas) are discharged through slits having a five-layered structure.

FIG. 14 is a cross-sectional view taken along a line 1-1' of the gas feeding nozzle shown in a perspective view in FIG. 15. In FIGS. 14-16, reference numerals 51, 57 designate first partition plates for separating flow paths for the gas C from the atmosphere, numerals 42, 50 designate first spacers for forming flow paths for the gas C, numerals 43, 49 designate second partition plates for separating flow paths for the gas B from flow paths for the gas C, numerals 44, 48 designate second spacers for forming flow paths for the gas B, numerals 45, 47 designate third partition plates for separating the flow path for the gas A from the flow paths for the gas B, a numeral 46 designates a spacer for forming the flow path the gas A, and numerals 58 designate gas supplying openings. Each of the partition plates is provided with a groove 55 to feed the gas in the width direction of the partition plate.

A gas supplying opening may be formed in each of the partition plates as shown in the Figures. However, the gas supplying openings may be formed in the partition plates 41, 51 at both sides to feed three kinds of gasses. In this case, the gasses A and B are respectively supplied to the grooves of the partition plates, which are adjacent the spacers through which each of the gas is discharged, through holes formed in the other spacers and partition plates. In either case, the gasses are discharged separately from the slits having five-layered structure as shown in FIG. 15.

In the detail of the spacers for forming the flow paths for the gasses will be described.

The gas feeding nozzle for a CVD apparatus as shown in FIGS. 14-16, each of the spacers preferably has a thickness of 0.1 mm-10 mm, especially, 0.2 mm-5 mm. When the thickness of the spacer is less than that value, it is difficult to finish precisely the spacers, and uniformity in the gap space of the slit is impaired, whereby the uniformity of the stream of gas in the width direction is impaired. On the other hand, when the thickness is greater than that value, the distance between a gas stream and an adjacent gas stream is large; accordingly, mixing and diffusion of the gasses are insufficient, and desired deposition of the film on the substrate can not be obtained.

Figure 17:
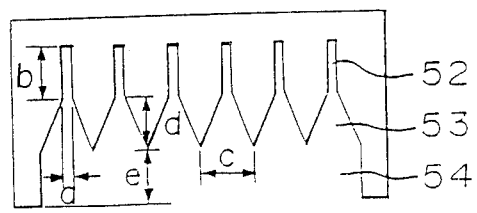
FIGS. 17 and 18 are respectively front views of embodiments of spacers used for the gas feeding nozzle of the present invention.
Figure 18:
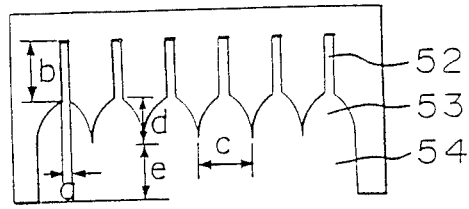

FIGS. 17 and 18 show preferred embodiments of the spacers used for this embodiment. In the preferred embodiments, each of the spacers has a plurality of first cut portions 52 having a width (a) of 0.1 mm-100 mm and a length (b) of 0.1 mm-150 mm, a plurality of second cut portions 53 having a length (d) of 150 mm or less and an expansion ratio of width of flow path (c/a) of 500 or less, each of the second cut portions being communicated with each of the first cut portions 52 and having a flow path being gradually widened in the direction of gas flow, and a cut portion 54 having a length (e) of 100 mm or less which extends between the ends of the second cut portions at which gas streams flowing the second cut portions are merged and the gas discharging aperture.

When the width (a) of the first cut portions 52 is less than 0.1 mm, it is difficult to finish precisely the spacers. When the width (a) is greater than 100 mm, it is difficult to maintain a uniform air gap in the slit in its width direction. In either case, uniformity of the flow rate of the discharged gas in its width direction is impaired.

When the length (b) of the first cut portion 52 is less than 0.1 mm, it is difficult to finish precisely the cut portion, whereas when it is greater than 150 mm, the nozzle becomes too large and it can not be used practically.

When the length (d) of the second cut portions 53 having one end communicated with each of the first cut portions 52 and having a flow path being gradually widened in the direction of gas flow is greater than 150 mm, the nozzle becomes large and it can not be used practically.

When the expansion ratio (c/d) is greater than 500, the gas ejected from the first cut portions 52 is discharged from the nozzle without spreading in the width direction of the second cut portions 53, and uniformity of the gas flow in the width direction is impaired.

When the length of the cut portion 54 is greater than 100 mm, it is difficult to maintain a uniform air gap in the slit. The shape of the second cut portions 53 may be in a linear form as shown in FIG. 17 or a curved form as shown in FIG. 18.

The flow of gas in the gas feeding nozzle for a normal pressure CVD apparatus according to the present invention will be described with reference to FIG. 16. The gas C introduced into the groove 55 formed in the first partition plate 41 through the gas supplying opening spreads in the width direction of the groove 55. In FIG. 16, a gas feeding means for only the gas C is shown, however the same explanation is applicable to the gasses A and B. The gas C in the groove 55 is passed through the cut portions of the spacer and is finally discharged through the slit-like discharging aperture. In the spacer, the first cut portions 52 are formed precisely to have the same size and to provide a sufficient flow resistance to the gas flowing therethrough. Accordingly, the gas is passed through the first cut portions at the substantially same flow rate and is spread in the second cut portions 53 in the width direction, whereby a uniform stream of gas is provided from the nozzle. Projections defined by the second cut portions in each of the spacers maintain the air gap of the slit near the discharging area to be constant.

It is desirable that the structural elements of the gas feeding nozzle of the present invention are made of a material such as metal (for instance, stainless steel), ceramics and so on which has excellent heat resistance, chemical durability and physical durability.

Thus, in accordance with the gas feeding nozzle for a CVD apparatus according to the present invention, the discharged gas is regulated and flows uniformly in the direction of width of the slits at constant flow speed and flow rate, i.e. a stable discharging condition of the gas can be obtained. Accordingly, a thin film having a uniform film thickness can be obtained. The gas feeding nozzle according to the present invention is suitable for a CVD apparatus for a large-scale production.

We claim:

1. A gas feeding nozzle for feeding at least one kind of gas to form a thin film on a substrate by a normal pressure vapor deposition process, comprising a plurality of plate-like bodies, each of said plate-like bodies having means for forming a gas-flowing path, which means comprises a first groove elongated in the width direction of said plate-like bodies, a plurality of second grooves in an elongated form, each of said second grooves having one end communicated with said first groove, third grooves each having one end communicated with the other end of one of said second grooves and an other end which is gradually widened in the direction of gas flow to merge the gas stream flowing in each of said third grooves with the gas stream flowing in the adjacent grooves, and a fourth groove extending between the said ends of the third grooves at which the gas streams are merged to form a gas discharging aperture, wherein in said fourth groove, the distance between the ends of each of said third grooves at which the gas streams are merged to said discharging aperture is 100 mm or less.

2. The gas feeding nozzle according to claim 1, wherein the thickness of said plate-like bodies constituting said nozzle is in the range of from 0.2 mm to 20 mm.

3. The gas feeding nozzle according to claim 1, wherein said second groove has a width of 0.1 mm–100 mm, a depth of 0.1 mm or more and a length of 0.1 mm–150 mm.

4. The gas feeding nozzle according to claim 1, wherein each of said third groove has a length of 150 mm or less, a depth of 0.1 mm or more and an expansion ratio in cross section area of gas flow path of 500 or less.

5. A gas feeding nozzle for feeding at least one kind of gas to form a thin film on a substrate by a normal pressure chemical vapor deposition process, comprising a plurality of plate-like bodies including at least one gas supplying plate provided with at least one gas supplying opening and at least one groove for flowing the gas in its width direction, said gas supplying plate comprising at least an outermost one of said plate-like bodies; at least one slit-like gas discharging aperture formed between two of said plate-like bodies; and at least one gas flowing path between said gas supplying plate and said gas discharging aperture, said gas flowing path comprising at least one elongated hole having substantially the same width as the width of the gas discharging aperture and formed in said plate-like bodies, wherein a difference in static pressure between said gas supplying opening and said gas discharging aperture when the gas is discharged through said gas discharge aperture is more than 10 times the maximum difference in static pressure distribution inside said groove.

6. A gas feeding nozzle for feeding at least one kind of gas to form a thin film on a substrate by a normal pressure chemical vapor deposition process, comprising:
   at least one gas supplying plate;
   at least one plate-like spacer having a plurality of cut portions extending in a gas discharge direction;
   at least one partition plate stacked with said at least one spacer such that each said at least one partition plate separates gasses flowing in said cut portions in adjacent ones of said at least one spacer to form at least one slit-like gas discharge aperture,
   wherein each of said cut portions comprises a plurality of first cut portions having a width of 0.1 mm, and a length of 0.1 mm-150 mm, a plurality of second cut portions each communicating with one of said first cut portions and having a length of 150 mm or less and a flow path width expansion ratio of 500 or less so that the gas flow path gradually increases in the direction of gas flow whereby the gas passing therethrough is merged with the gas flowing through an adjacent second cut portion, and a third cut portion having a length of 100 mm or less for discharging the merged gas to said at least one gas discharging aperture.

7. A gas feeding nozzle for feeding at least one kind of gas to form a thin film on a substrate by a normal pressure chemical vapor deposition process, comprising:
   at least one gas supplying plate having gas supplying means including an elongate groove;
   at least one plate-like spacer having a plurality of cut portions extending in a gas discharge direction;
   at least one partition plate stacked with said at least one spacer such that each said at least one partition plate separates gasses flowing in said cut portions in adjacent ones of said at least one spacer to form at least one slit-like gas discharge aperture, said gas supplying plate being attached to the stack; and
   a gas feeding path formed between said elongate groove and said cut portions, comprising at least one elongate hole extending through said gas supplying plates and said spacers and having a length substantially corresponding to a length of said gas discharge apertures,
   wherein a difference in static pressure between said gas supplying opening and said gas discharging aperture when the gas is discharged through said gas discharge apertures is more than 10 times the maximum difference in static pressure distribution inside said groove.

8. The gas feeding nozzle according to claim 7, wherein said spacers are formed by a plate-like body having a thickness of 0.1 mm–10 mm.

9. The gas feeding nozzle according to claim 7, wherein said partition plates are formed by a plate-like body having a thickness of 0.1 mm–10 mm.

10. A gas feeding nozzle for feeding at least one kind of gas to form a thin film on a substrate by a normal pressure chemical vapor deposition process, comprising:
   at least one gas supplying plate having gas supplying means including an elongate groove;
   at least one plate-like spacer having a plurality of cut portions extending in a gas discharge direction;
   at least one partition plate stacked in a unit with said at least one spacer such that each said at least one partition plate separates gasses flowing in said cut portions in adjacent ones of said at least one spacer to form at least one slit-like gas discharge aperture, said gas supplying plate being attached to the stack; and
   a gas feeding path formed in said unit between said elongate groove and said cut portions, comprising at least one elongate hole extending through said gas supplying plates and said spacers and which have a length substantially corresponding to a length of said gas discharge apertures,
   wherein each of said cut portions comprises a plurality of first thin cut portions having a width of 0.1 mm-100 mm and a length of 0.1 mm-150 mm, a plurality of second cut portions each communicating with one of said first cut portions and having a length of 150 mm or less and a flow path width expansion ratio of 500 or less so that the gas flow path gradually increases in the direction of gas flow, whereby the gas passing therethrough is merged with the gas flowing through an adjacent second cut portion, and a third cut portion having a length of 100 mm or less for discharging the merged gas to said gas discharging aperture.

11. A normal pressure chemical vapor deposition apparatus having a gas feeding nozzle which is constituted by a plurality of plate-like bodies, said plate-like bodies being composed of:
   at least one partition plate having at least one gas supplying opening and a groove on one side thereof and elongated in the width direction of the partition plate, and
   at least one spacer adjacent to said partition plate; said spacer having a plurality of cut portions in the gas-discharging direction, said partition plate and said spacer being stacked alternately to form at least one slit-like gas discharging aperture, wherein in each said slit-like gas discharging aperture, gas is to flow from said gas supplying opening and through said elongated groove in the partition plate, and next through a plurality of cut portions in the spacer adjacent to said partition plate.

12. The normal pressure chemical vapor deposition apparatus according to claim 11, wherein each of said spacers has a plurality of first cut portions having a width of 0.1 mm-10 mm, and a length of 0.1 mm-150 mm, second cut portions each having a length of 150 mm or less and an expansion ratio in width of flow path of 500 or less which is communicated with each of said first cut portions, said gas flow path gradually increasing in the direction of gas flow to finally render the gas passing therethrough to be merged with the gas flowing through the adjacent second cut portion or portions, and a third cut portion having a length of 100 mm or less to discharge the merged gas to said gas discharging aperture.

13. A normal pressure chemical vapor deposition apparatus having a gas feeding nozzle which is constituted by a plurality of plate-like bodies, said plate-like bodies being composed of:
   at least one spacer having a plurality of cut portions in the gas-discharging direction,
   at least one partition plate for separating a stream of gas from another, adjacently flowing stream of gas,
   at least one gas supplying plate having at least one gas supplying opening for each kind of gas, and an elongated groove for each gas to flow in the width direction of said gas supplying plate; and
   at least one slit-like gas discharging aperture formed by stacking said spacer and said partition plates alternately, and stacking said gas supplying plate on at least one side of the alternately stacked plate-like bodies; wherein an elongated hole, which is extended to substantially the entire width of the gas feeding nozzle, is formed for each gas stream in said partition plates and spacers and is interposed between said gas supplying plate and said spacer, so that a gas feeding plate is formed for each gas stream from said elongated groove in the gas supplying plate through to the cut portions in said spacer.

14. The normal pressure chemical vapor deposition apparatus according to claim 13, wherein said spacers are formed by a plate-like body having a thickness of 0.1 mm-10 mm.

15. The normal pressure chemical vapor deposition apparatus according to claim 13, wherein said partition plates are formed by a plate-like body having a thickness of 0.1 mm-10 mm.

16. The normal pressure chemical vapor deposition apparatus according to claim 13, wherein difference in static pressure between said gas supplying opening and said gas discharging aperture when the gas is discharged through said nozzle is more than 10 times the maximum difference in static pressure distribution inside said groove in which the gas flows in the width direction of said gas supplying plate.

17. The normal pressure chemical vapor deposition apparatus according to claim 13, wherein each of said spacers has a plurality of first thin cut portions having a width of 0.1 mm-100 mm and a length of 0.1 mm-150 mm, second cut portions each having a length of 150 mm or less and an expansion ratio in width of flow path of 500 or less which is communicated with each of said first cut portions, said gas flow path gradually increasing in the direction of gas flow to finally render the gas passing therethrough to be merged with the gas flowing through the adjacent second cut portion or portions, and a third cut portion having a length of 100 mm or less to discharge the merged gas to said gas discharging aperture.

18. A normal pressure chemical vapor deposition apparatus having a gas feeding nozzle which is constituted by a plurality of plate-like bodies, each of said plate-like bodies having a recess for a gas-flowing path, said recess being composed of:
   a first groove elongated in the width direction of said plate-like body,
   a plurality of second grooves elongated in the gas-discharging direction, each having one end communicated with said first groove,
   a plurality of third grooves each having one end communicated with the other end of each of said second grooves, each of the third grooves being gradually widened in the direction of gas flow so that the gas stream flowing in each of said third grooves is merged with the gas stream flowing in the adjacent third groove, and a fourth groove extending from the ends of the third grooves to the end of said plate-like body.

19. The normal pressure chemical vapor deposition apparatus according to claim 18, wherein the thickness of said plate-like bodies constituting said nozzle is in the range of from 0.2 mm to 20 mm.

20. The normal pressure chemical vapor deposition apparatus according to claim 18, wherein said second groove has a width of 0.1 mm–100 mm, a depth of 0.1 mm or more and a length of 0.1 mm–150 mm.

21. The normal pressure chemical vapor deposition apparatus according to claim 18, wherein each of said third grooves has a length of 150 mm or less, a depth of 0.1 mm or more and an expansion ratio in cross section area of gas flow path of 500 or less.

22. The normal pressure chemical vapor deposition apparatus according to claim 18, wherein in said fourth groove, the distance between the end of each of said third grooves at which the gas streams are merged to said discharging aperture is 100 mm or less.

23. A normal pressure chemical vapor deposition apparatus having a gas feeding nozzle which is constituted by a plurality of plate-like bodies, said plate-like bodies including:

at least one gas supplying plate; said gas supplying plate being provided with at least one gas supplying opening and at least one groove for flowing the gas in its width direction and being attached to at least one of the outermost plate-like bodies; and a single or a plurality of slit-like gas discharging apertures formed between said gas supplying plate and another plate-like body or between said other plate-like bodies, wherein in order to form a single or a plurality of gas flowing paths between said gas supplying plate and said plate-like body for forming said gas discharging aperture, a single or a plurality of elongated holes, which are extended to substantially the entire width with respect to the width of the gas stream discharged, are formed in said plate-like bodies interposed between said gas supplying plate and said plate-like body for forming said gas discharging aperture.

24. The normal pressure chemical vapor deposition apparatus according to claim 23, wherein a difference in static pressure between said gas supplying opening and said gas discharging aperture when the gas is discharged through said nozzle is more than 10 times the maximum difference in static pressure distribution inside said groove for flowing the gas in the width direction of said gas supplying plate.

* * * * *